(12) United States Patent
Aiba et al.

(10) Patent No.: US 7,704,307 B2
(45) Date of Patent: Apr. 27, 2010

(54) ELECTROLESS PALLADIUM PLATING LIQUID

(75) Inventors: Akihiro Aiba, Kitaibaraki (JP); Hirofumi Takahashi, Kitaibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 155 days.

(21) Appl. No.: 11/988,353

(22) PCT Filed: Jul. 7, 2006

(86) PCT No.: PCT/JP2006/313565
§ 371 (c)(1), (2), (4) Date: Jan. 4, 2008

(87) PCT Pub. No.: WO2007/010760
PCT Pub. Date: Jan. 25, 2007

(65) Prior Publication Data
US 2009/0081369 A1    Mar. 26, 2009

(30) Foreign Application Priority Data
Jul. 20, 2005    (JP) .............................. 2005-209696

(51) Int. Cl.
C23C 18/44    (2006.01)
B05D 1/18    (2006.01)
(52) U.S. Cl. .................... 106/1.24; 106/1.28; 427/443.1
(58) Field of Classification Search ................ 106/1.24, 106/1.28; 427/304, 443.1
See application file for complete search history.

(56) References Cited

U.S. PATENT DOCUMENTS

| | | | | |
|---|---|---|---|---|
| 3,615,737 A | * | 10/1971 | Schneble et al. | 427/443.1 |
| 4,143,186 A | * | 3/1979 | Davis | 427/443.1 |
| 4,804,410 A | * | 2/1989 | Haga et al. | 106/1.28 |
| 5,269,838 A | * | 12/1993 | Inoue et al. | 427/443.1 |
| 5,292,361 A | * | 3/1994 | Otsuka et al. | 106/1.28 |
| 2006/0251910 A1 | * | 11/2006 | Lancsek et al. | 427/443.1 |

FOREIGN PATENT DOCUMENTS

| | | |
|---|---|---|
| JP | 5-039580 | 2/1993 |
| JP | 7-062549 | 3/1995 |
| JP | 8-028561 | 3/1996 |
| JP | 2000-129454 | 5/2000 |
| JP | 3 204 035 | 6/2001 |
| JP | 2001-295061 | 10/2001 |

OTHER PUBLICATIONS

Machine translation of JP 2001/295061, Oct. 2001.*
"Current Status and Future Development of Electroless Palladium Plating", Hidemi Nawafune, Printed Circuit Information, 1995(8), pp. 27-32, published Dec. 31, 1995.
"The Fundamental and Practice of Electroless Plating", Xiaoxia Jiang and Wei Shen, published by National Defense Industry Press on Jun. 30, 2000.

* cited by examiner

*Primary Examiner*—Helene Klemanski
(74) *Attorney, Agent, or Firm*—Flynn, Thiel, Boutell & Tanis, P.C.

(57) ABSTRACT

An electroless palladium plating liquid, with excellent bath stability, that can provide a film with excellent corrosion resistance, solder bondability, and wire bondability is provided. The invention is an electroless palladium plating liquid, containing: a water soluble palladium compound; at least one of ammonia, an amine compound, an aminocarboxylic acid compound, and carboxylic acid as a complexing agent; and bismuth or a bismuth compound as a stabilizer. Preferably the electroless palladium plating liquid further contains at least one of hypophosphorous acid, phosphorous acid, formic acid, acetic acid, hydrazine, a boron hydride compound, an amine borane compound, and salts thereof as a reducing agent.

4 Claims, No Drawings

ELECTROLESS PALLADIUM PLATING LIQUID

TECHNICAL FIELD

The present invention relates to an electroless palladium plating liquid used for plating electronic components and the like as well as to plated articles and a plating method.

BACKGROUND ART

Electroless nickel/gold plating liquids have been used in order to improve the corrosion resistance of a base metal, solder bondability, and wire bondability. In particular, these plating liquids are used on package boards that contain semiconductor bumps or semiconductors, and boards for mobile phones and the like.

In recent years, there have been demands to further improve the corrosion resistance and solder bondability in order to improve the reliability in conjunction with increased performance of electrical equipment, and inserting electroless palladium plating between electroless nickel plating and electroless gold plating has been effective. The electroless palladium plating liquid can be the plating liquids shown in Patent document 1 or Patent document 2. These electroless palladium plating liquids contain a sulfur compound as a bath stabilizer, and therefore trace amounts of sulfur are codeposited in the palladium film, but the sulfur will segregate, which causes a loss in corrosion resistance and solder bondability.

Patent Document 1: U.S. Pat. No. 3,204,035

Patent Document 2: Japanese Patent Publication H8-28561

DISCLOSURE OF THE INVENTION

Problems that the Invention is to Solve

In light of the foregoing, an object of the present invention is to provide an electroless palladium plating liquid with excellent bath stability that can provide a film with excellent corrosion resistance, solder bondability, and wire bondability.

Means for Solving the Problems

As a result of diligent research to achieve the aforementioned object, the present inventors have discovered that an electroless palladium plating liquid that has good bath stability at the same level as when a sulfur compound is used and that can provide a film with even superior corrosion resistance, solder bondability and wire bondability can be achieved by using bismuth or a bismuth compound as a bath stabilizer in place of the sulfur compound.

In other words, the present invention has the following construction.

(1) An electroless palladium plating liquid, comprising: a water-soluble palladium compound; at least one of ammonia, an amine compound, an aminocarboxylic acid compound, and carboxylic acid as a complexing agent; and bismuth or a bismuth compound as a stabilizer.

(2) The electroless palladium plating liquid according to (1), further comprising at least one of hypophosphorous acid, phosphorous acid, formic acid, acetic acid, hydrazine, a boron hydride compound, an amine borane compound, and salts thereof, as a reducing agent.

(3) A palladium plated article, in which a film is formed using the electroless palladium plating liquid according to (1) or (2).

(4) A plating method, comprising forming a film by electroless plating using the electroless palladium plating liquid according to (1) or (2).

EFFECTS OF THE INVENTION

The electroless palladium plating liquid of the present invention has good stability and provides a film with excellent corrosion resistance, solder bondability, and wire bondability. Therefore, corrosion resistance and solder bondability will be improved by plating with the electroless palladium plating liquid of the present invention after nickel plating a base such as a printed wiring board.

BEST MODE FOR CARRYING OUT THE INVENTION

The electroless palladium plating liquid of the present invention will be described below in detail.

The electroless palladium plating liquid of the present invention is an aqueous solution comprising: a water soluble palladium compound; at least one of ammonia, an amine compound, an aminocarboxylic acid compound, and carboxylic acid as a complexing agent; and bismuth or a bismuth compound as a stabilizer.

The water soluble palladium compound is not particularly restricted, and examples thereof include palladium chloride, a chloroammine palladium such as dichlorotetraammine palladium, ammine palladium, palladium sulfate, palladium nitrite, and palladium acetate, and the like. The electroless palladium plating liquid of the present invention contains between 0.01 g/L and 100 g/L, preferably between 0.1 g/L and 20 g/L of the water soluble palladium compounds in the plating liquid. If the concentration of the water soluble palladium compound is less than 0.01 g/L, the plating speed will be markedly lower, but if the concentration exceeds 100 g/L, the effect will be saturated with no merit.

The amine compound complexing agent is not particularly restricted, and examples include methyl amine, dimethyl amine, trimethyl amine, ethylamine, diethylamine, triethylamine, benzylamine, methylenediamine, ethylenediamine, tetramethylenediamine, diethylenetriamine, triethylenetetramine, tetraethylenepentamine, hexamethylenetetramine, and the like.

The aminocarboxylic acid compound is not particularly restricted, and examples include ethylenediaminetetraacetate, hydroxyethylethylenediaminetriacetate, dihydroxyethylethylenediaminediacetate, propanediaminetetracetate, diethylenetriaminepentacetate, trimethylenetetraminehexacetate, glycine, glycylglycine, glycylglycylglycine, dihydroxyethylglycine, iminodiacetate, hydroxyethyl iminodiacetate, nitrilotriacetate, and nitrilotripropionate, as well as alkali metal salts, alkaline earth metal salts, and ammonium salts thereof.

The carboxylic acid is not particularly restricted, and examples include formic acid, acetic acid, propionic acid, citric acid, malonic acid, malic acid, oxalic acid, succinic acid, tartaric acid, lactic acid, and butanoic acid and the like.

The complexing agent can be at least one of ammonia, an amine compound, an aminocarboxylic acid compound, or a carboxylic acid, but amine compounds and aminocarboxylic acid compounds are preferable.

The concentration of complexing agent in the plating liquid is preferably between 0.01 g/L and 200 g/L, preferably between 0.1 g/L and 100 g/L. If the concentration of complexing agent is less than 0.01 g/L, the complexing capability will be weak, but if the concentration exceeds 200 g/L, the effect will be saturated without merit.

Bismuth or bismuth compounds are used as a stabilizer. The bismuth compounds are not restricted in particular, and examples include bismuth oxide, bismuth sulfate, bismuth sulfite, bismuth nitrate, bismuth chloride, and bismuth acetate and the like. The concentration of stabilizer in the plating liquid is between 0.1 mg/L and 1000 mg/L, preferably between 1 mg/L and 100 mg/L. If the concentration of stabilizer is less than 0.1 mg/L, the stability of the bath will be reduced, but if the concentration exceeds 1000 mg/L, the plating speed will be reduced.

Preferably the electroless palladium plating liquid of the present invention further comprises at least one of hypophosphorous acid, phosphorous acid, formic acid, acetic acid, hydrazine, boron hydride compound, amine borane compound, and salts thereof as a reducing agent. The boron hydride compound is not restricted in particular, and examples include sodium borohydride, potassium borohydride, and ammonium borohydride, and the amine borane compound is also not particularly restricted, and examples include dimethylamine borane, and diethylamine borane and the like. Furthermore, the salts of the aforementioned acids can be alkali metal salts, alkali earth metal salts, ammonium salts and the like.

The reducing agent is preferably phosphorous acid, hypophosphorous acid, or a salt thereof.

The concentration of reducing agents in the plating liquid is between 0.01 g/L and 200 g/L, preferably between 0.1 g/L and 100 g/L. If the concentration of reducing agents is less than 0.01 g/L, the plating speed will be reduced, but if the concentration exceeds 200 g/L, the effect will be saturated, the liquid may decompose, and there will be no merit.

Furthermore, if necessary, a pH buffer can also be added to the electroless palladium plating liquid of the present invention. Phosphoric acid compounds are particularly preferable as the pH buffer.

Examples of the phosphoric acid compounds include phosphoric acid, and pyrophosphoric acid as well as alkali metal salts, alkali earth metal salts, and ammonium salts thereof, alkali metal dihydrogenphosphates, alkali earth metal dihydrogenphosphates, ammonium dihydrogenphosphate, dialkali metal hydrogenphosphates, dialkali earth metal hydrogenphosphates and diammonium hydrogenphosphate, and the like. The concentration of phosphoric acid compounds in the plating liquid is preferably between 0.01 g/L and 200 g/L, more preferably between 0.1 g/L and 100 g/L.

The pH of the gold plating liquid is preferably adjusted to a pH between 4 and 10, more preferably adjusted to a pH between 5 and 9, using the aforementioned compounds as a pH buffer.

Furthermore, the gold plating liquid of the present invention is preferably used at a bath temperature between 10 and 95° C., more preferably at a temperature between 25 and 70° C.

If the pH of the plating liquid and the bath temperature are outside of the aforementioned ranges, the plating speed will be slow, or problems with bath decomposition can easily occur.

The plating method can be a method of immersing an article to be plated in the plating liquid of the present invention.

The article to be plated can be a package board on which a semiconductor bump or a semiconductor is mounted, or an electronic component such as a printed wiring board, and the electroless palladium plating liquid of the present invention is suitable for use as plating for bonding in these articles and especially for electroless palladium plating to be inserted between electroless nickel plating and electroless gold plating.

EXAMPLE

The present invention will be further described using the examples and comparative examples shown below.

Examples 1 to 5 and Comparative Examples 1 to 3

A Plating liquid bath having each of the compositions shown in Table 1 was made up as the electroless palladium plating liquid. Plating was performed by the following procedure using a BGA printed wiring board substrate with 500 pads with a 0.48 mm diameter resist opening as an article to be plated.

Alkaline degreasing (KG-510 made by Nikko Metal Plating Co. Ltd.) (45° C., pH 12, 0.2 minutes)

Soft etching (sulfuric acid-sodium persulfate system, 25° C., 45 seconds)

Washing with 3% sulfuric (25° C., 2 minutes)

Predipping (hydrochloric acid system, 25° C., 30 seconds)

Application of an activator (KG-522 made by Nikko Metal Plating Co., Ltd.) (chloride system, palladium concentration: 50 mg/L, 25° C., pH of less than 1.0, 2 minutes)]

Washing with 3% sulfuric acid (25° C., 10 seconds)

Electroless nickel plating (plating liquid: KG-530 made by Nikko Metal Plating Co., Ltd.) (88° C., pH of 4.5, 25 minutes, phosphorus content of 7%)

Electroless palladium plating (plating conditions and liquids shown in Table 1)

Electroless gold plating (plating liquid: KG-545 made by Nikko Metal Plating Co., Ltd.) (gold concentration: 2.0 g/L, 88° C., pH of 5.0, 10 minutes).

(A 1-minute water washing step was performed between all the steps except for between the steps of predipping and application of activator.)

Each plated article that was obtained was evaluated as shown below.

Corrosion Resistance:

After performing the prescribed plating, the substrate was immersed for 10 minutes in a 20 vol % aqueous solution of nitric acid, and then water washed and dried. Next, the appearance of the gold plating at each pad was observed under an optical microscope at 50×. Of the 500 pads, an evaluation of ○ was made if less than 1% were discolored; an evaluation of Δ was made if 1% or more and less than 10% were discolored, and an evaluation of X was made if 10% or more were discolored.

Solder Bonding Strength:

After performing the prescribed plating, the substrate was heated at 165° C. for 24 hours. Next, flux was applied to 20 of the 0.48 mm diameter pads, a 0.6 mm diameter solder ball of Sn-4.0 Ag-0.5 Cu was placed thereon and reflowed at a peak temperature of 250° C. using a reflow oven. The bonding strength was measured by a heat and pull method using a Bond Tester 4000 manufactured by Dage Arctek Co., Ltd.

Bath Life:

A turn test was performed by actually performing palladium plating on a substrate. For the case of the plating liquid with a palladium concentration of 2 g/L, plating until 2 g/L of palladium had deposited onto the substrate is referred to as 1 MTO. Normally, the electroless palladium plating liquid is renewed when the bath is between approximately 3 and 5 MTO, so if the bath stability is at least 5 MTO, the stability can be considered good. Therefore, the turn test was performed up to 5 MTO, and then the bath was evaluated for bath decomposition and a reduction in film properties. However, the palladium was replenished each time the concentration of palladium in the turn test dropped to approximately 10%.

Evaluation results are shown in Table 1.

TABLE 1-1

| | | Embodiments | | | |
|---|---|---|---|---|---|
| | | 1 | 2 | 3 | 4 |
| Bath composition | Palladium compound | Palladium chloride: 2 g/L (Pd) | Palladium chloride: 1 g/L (Pd) | Dichlorotetraammine palladium: 1 g/L (Pd) | Dichlorotetraammine palladium: 2 g/L (Pd) |
| | Reducing agent | Sodium phosphonate: 5 g/L | Sodium hypophosphite: 10 g/L | Sodium hypophosphite: 5 g/L | Formic acid: 5 g/L |
| | Stabilizer | Bismuth chloride: 1 mg/L | Bismuth nitrate: 5 mg/L | Bismuth nitrate: 10 mg/L | Bismuth nitrate: 20 mg/L |
| | Complexing agent | Nitrilotriacetate: 5 g/L | Ethylenediamine-tetraacetate: 5 g/L | Ethylenediamine: 5 g/L | Ethylenediamine-tetraacetate: 5 g/L |
| | PH buffer | Sodium dihydrogenphosphate: 5 g/L | — | Sodium dihydrogenphosphate: 5 g/L | Sodium dihydrogenphosphate: 5 g/L |
| Plating Conditions | pH | 7.0 | 7.0 | 7.0 | 7.0 |
| | Processing Temperature (° C.) | 50 | 40 | 40 | 60 |
| | Processing time (min) | 4 | 6 | 6 | 4 |
| Evaluation Results | Film thickness (μm) | 0.05 | 0.05 | 0.05 | 0.05 |
| | Corrosion resistance | ○ | ○ | ○ | ○ |
| | Solder Bonding Strength (gf) | 2506 | 2525 | 2537 | 2478 |
| | Bath Life (MTO) | >5 | >5 | >5 | >5 |

| | | Embodiment | Comparative Examples | | |
|---|---|---|---|---|---|
| | | 5 | 1 | 2 | 3 |
| Bath Composition | Palladium compound | Palladium chloride: 2 g/L (Pd) | Palladium chloride: 2 g/L (Pd) | Palladium chloride: 2 g/L (Pd) | Palladium chloride: 2 g/L (Pd) |
| | Reducing agent | Dimethylamine borane: 5 g/L | Sodium phosphonate: 20 g/L | Dimethylamine borane: 10 g/L | Formic acid: 5 g/L |
| | Stabilizer | Bismuth sulfate: 10 mg/L | Sodium dithionate: 40 mg/L | Thiodiglycolic acid: 20 mg/L | Thioglycolic acid: 20 mg/L |
| | Complexing agent | Ethylenediamine: 25 g/L | Ethylenediamine: 25 g/L | Ethylenediamine: 25 g/L | Citric acid: 10 g/L |
| | pH buffer | — | — | — | — |
| Plating Conditions | pH | 7.0 | 8.0 | 8.0 | 6.0 |
| | Processing Temperature (° C.) | 40 | 70 | 70 | 70 |
| | Processing time (min) | 6 | 3 | 3 | 3 |
| Evaluation Results | Film thickness (μm) | 0.05 | 0.05 | 0.05 | 0.05 |
| | Corrosion resistance | ○ | Δ | Δ | Δ |
| | Solder Bonding Strength (gf) | 2469 | 2319 | 2228 | 2294 |
| | Bath life (MTO) | >5 | >5 | >5 | >5 |

From the results in Table 1, it can be seen that the electroless palladium plating liquid of the present invention has excellent corrosion resistance and solder bondability. Furthermore, the stability was excellent at the same level as a conventional plating liquid that uses a sulfur compound as a stabilizer.

The invention claimed is:

1. An electroless palladium plating liquid, comprising:
a water-soluble palladium compound containing palladium as the sole metal to be plated;
at least one of ammonia, an amine compound, an aminocarboxylic acid compound and a carboxylic acid as a complexing agent; and
bismuth or a bismuth compound as a stabilizer.

2. The electroless palladium plating liquid according to claim 1, further comprising at least one of hypophosphorous acid, phosphorous acid, formic acid, acetic acid, hydrazine, a boron hydride compound, an amine borane compound, and salts thereof, as a reducing agent.

3. A palladium plated article comprising a palladium layer formed from the electroless palladium plating liquid of claim 1, provided between an electroless nickel plating layer and an electroless gold plating layer, the plated article having a discoloration of less than 1% in a corrosion resistance test.

4. A method of forming an electroless palladium plating on an article comprising a step of immersing the article in the electroless palladium plating liquid of claim 1.

* * * * *